United States Patent [19]

McMahon

[11] Patent Number: 5,321,583
[45] Date of Patent: Jun. 14, 1994

[54] ELECTRICALLY CONDUCTIVE INTERPOSER AND ARRAY PACKAGE CONCEPT FOR INTERCONNECTING TO A CIRCUIT BOARD

[75] Inventor: John F. McMahon, Phoenix, Ariz.

[73] Assignee: Intel Corporation, Santa Clara, Calif.

[21] Appl. No.: 984,335

[22] Filed: Dec. 2, 1992

[51] Int. Cl.[5] .............................................. H05K 7/12
[52] U.S. Cl. .................................. 361/770; 361/749; 361/760; 361/807; 174/255; 257/678; 439/91
[58] Field of Search ............... 361/380, 397, 400, 401, 361/403, 398, 413, 418, 417, 749, 748, 760, 770, 761, 785, 767, 807, 808; 174/255, 262; 257/678; 439/66, 91

[56] References Cited

U.S. PATENT DOCUMENTS 3,634,807  1/1972  Grobe .......................... 339/17 LC
5,159,535 10/1992  Desai et al. ...................... 361/398

Primary Examiner—Leo P. Picard
Assistant Examiner—Young Whang
Attorney, Agent, or Firm—Blakely, Sokoloff Taylor & Zafman

[57] ABSTRACT

An electronic assembly that includes an electronic package which is coupled to a circuit board by a plurality of metal spheres that are captured by an interposer. The metal spheres electrically couple a plurality of first conductive pads on the electronic package with a plurality of second conductive pads on the circuit board. The spheres are pressed into operative contact with the conductive pads by a clamp adapted to apply a pressure to the electronic package. The metal spheres are captured by the interposer so that the spheres can rotate relative to the electronic package and the circuit board. The rotating spheres function as bearings which allow the interposer and package to be removed from the clamp and board without detaching the clamp. The electronic package can be coupled to the circuit board by merely pushing the package and interposer between the clamp and board until the metal spheres are properly aligned with the conductive pads.

13 Claims, 1 Drawing Sheet

ELECTRICALLY CONDUCTIVE INTERPOSER AND ARRAY PACKAGE CONCEPT FOR INTERCONNECTING TO A CIRCUIT BOARD

BACKGROUND OF THE INVENTION

1. Field of the Invention

The present invention relates to an assembly and method for interconnecting an electronic package to a circuit board.

2. Description of Related Art

Semiconductor devices are typically housed within a plastic or ceramic package. Electronic packages are typically rectangular in shape and include a plurality of conductive pads on the bottom surface of the package. The pads are sometimes arranged in a grid like pattern to increase the output density of the package.

Electronic packages are typically mounted to a printed circuit board which has a plurality of surface pads or plated through holes arranged in the same pattern as the conductive pads on the packages. The electronic packages are typically coupled to the printed circuit board by soldering the conductive pads of the package to the surface pads of the board. The distance between the bottom of the package and the top of the board is very narrow, making it difficult to inspect all of the solder joints of the assembly. Solder joints are also susceptible to fatigue created by a continuous thermal cycling of the package and board. Repairing soldered electronic packages typically requires reflowing the solder of the entire board, which degrades the board and other components of the assembly.

Some board assemblies include a hold down clamp which mechanically couples the package(s) to the board. The clamp is typically connected to a spring which applies a pressure to the package and board. Instead of solder, such assemblies use pogo pins, conductive elastomers other spring-like members to interconnect the conductive pads of the package to the pads of the circuit board. The pins or elastomers are typically captured by an interposer which is placed between the package and board. The electronic package is typically assembled to the board by first placing the interposer and spring-like members on top of the circuit board, placing the package on top of the spring-like members and then mounting the clamp onto the package.

The clamp is typically attached to the circuit board by a number of screws. Assembling and repairing such a clamp assembly requires the constant insertion and removal of the screws. The screws are typically quite small, thereby requiring a non-conventional screw driver. It is desirable to have a package/board assembly which does not require solder and allows the package to be detached from the board without removing screws or other fasteners.

SUMMARY OF THE INVENTION

The present invention is an electronic assembly that includes an electronic package which is coupled to a circuit board by a plurality of metal spheres that are captured by an interposer. The metal spheres electrically couple a plurality of first conductive pads on the electronic package with a plurality of second conductive pads on the circuit board. The spheres are pressed into operative contact with the conductive pads by a clamp adapted to apply a pressure to the electronic package. The first conductive pads are typically constructed from a conductive elastomer which compensates for tolerances in the assembly.

The metal spheres are captured by the interposer so that the spheres can rotate relative to the electronic package and the circuit board. The rotating spheres function as bearings which allow the interposer and package to be removed from the clamp and board without detaching the clamp. The electronic package can be coupled to the circuit board by merely pushing the package and interposer between the clamp and board until the metal spheres are properly aligned with the conductive pads. The space between the clamp and circuit board is typically less than the combined thickness of the package and metal spheres, so that the clamp applies a pressure to the spheres when the package and interposer are inserted into the space.

Therefore it is an object of the present invention to provide an electronic assembly that can couple an electronic package to a circuit board without having to engage any fasteners.

It is also an object of the present invention to provide an electronic assembly which allows an electronic package to be coupled to a circuit board by merely sliding the package and an interposer between the board and a clamp with a low insertion force.

BRIEF DESCRIPTION OF THE DRAWINGS

The objects and advantages of the present invention will become more readily apparent to those ordinarily skilled in the art, after reviewing the following detailed description and accompanying drawings, wherein.

DETAILED DESCRIPTION OF THE INVENTION

Figure 1:
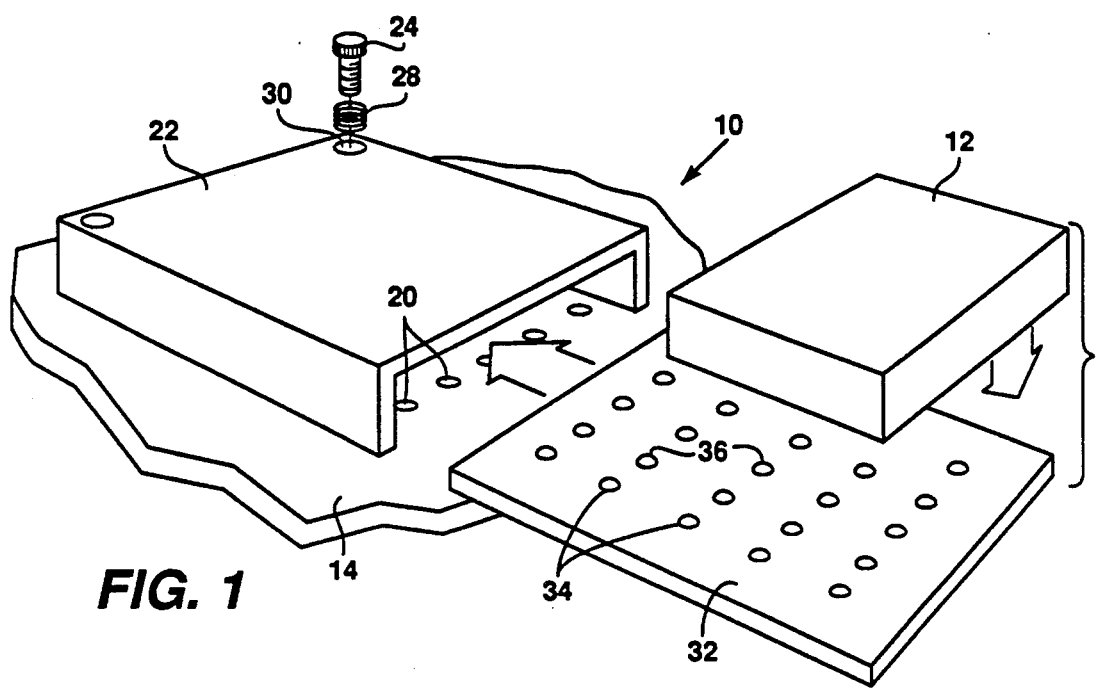
FIG. 1 is an exploded view of an electronic assembly of the present invention.
Figure 2:
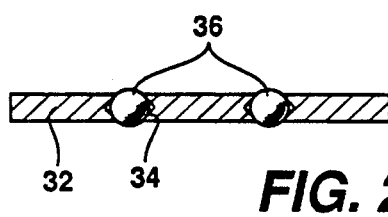
FIG. 2 is a cross-sectional view of an interposer which captures a plurality of metal spheres.
Figure 3:
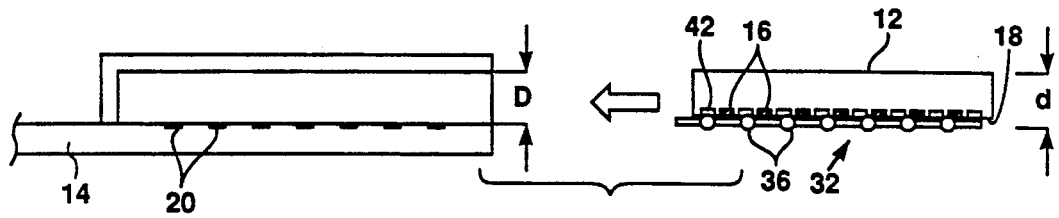
FIG. 3 is a side view of the electronic assembly before an electronic package and the interposer are inserted between a clamp and a circuit board.

Referring to the drawings more particularly by reference numbers, FIGS. 1-3 show an electronic assembly 10 of the present invention. The assembly couples an electronic package 12 to a circuit board 14. The electronic package 12 typically contains an integrated circuit (not shown) that is connected to a plurality of first conductive pads 16 located on the bottom surface 18 of the package 12. The integrated circuit may contain memory or logic elements as is known in the art.

The package 12 is typically rectangular in shape and is constructed from a plastic, ceramic or other dielectric material. The first conductive pads 16 are typically arranged in a grid-like pattern that provides an optimum pin density. The circuit board 14 has a plurality of second conductive pads 20 that are arranged in the same pattern as the first conductive pads 16. The printed circuit board 14 may be a single layer or multi-layered board which has a plurality of conductive lines that provide communication between the integrated circuit in the package 12 and other components mounted to the board 14. The second conductive pads 20 may be surface pads that are typically used with "via" technology, plated through holes, or other means of providing a conductive surface.

The assembly 10 includes a clamp 22 that is mounted to the circuit board 14. The clamp 22 may be connected to the board 14 by a number of screws 24. The screws 24 can be screwed into threaded holes (not shown) in the board 14, or a companion fixture that is also coupled to the circuit board 14. The screws 24 extend through clearance holes 26 in the clamp 22, so that the clamp 22 can move in a direction perpendicular to the second pads 20 of the board 14. Each screw 24 captures a compression spring 28 that is located in a counterbore 30 in the clamp 22. The springs 28 bias the clamp 22 into contact with the board 14. Although a spring subassembly is shown and described, it is to be understood that the present invention may employ any biasing means that presses the clamp 22 into contact with the board 14.

The assembly 10 includes an interposer 32 which has a plurality of openings 34 arranged in the same pattern as the first 16 and second 20 conductive pads. The interposer 32 is constructed from a dielectric material such as a plastic or ceramic. Within each opening 34 is a conductive member 36 which can rotate relative to the interposer 32. In the preferred embodiment, each conductive member 36 is a solid metal sphere constructed from an electrically conductive material such as copper. The copper is preferably plated with gold to prevent oxidation. Although a sphere is shown and described, the conductive members 36 may be cylindrical or have any other shape that allows the members 36 to rotate along a surface. Alternatively, the members 36 may be constructed from a metal plated non-conductive material which is both light and strong. The openings 34 are preferable constructed so that the conductive members 36 are captured by the interposer 32, so that the spheres 36 do not fall out of the openings 34. As shown in FIG. 3, the openings 34 preferably taper toward each surface of the interposer 32. The interposer 32 is typically flexible enough to allow the conductive members 36 to be pushed into the openings 34.

Figure 4:
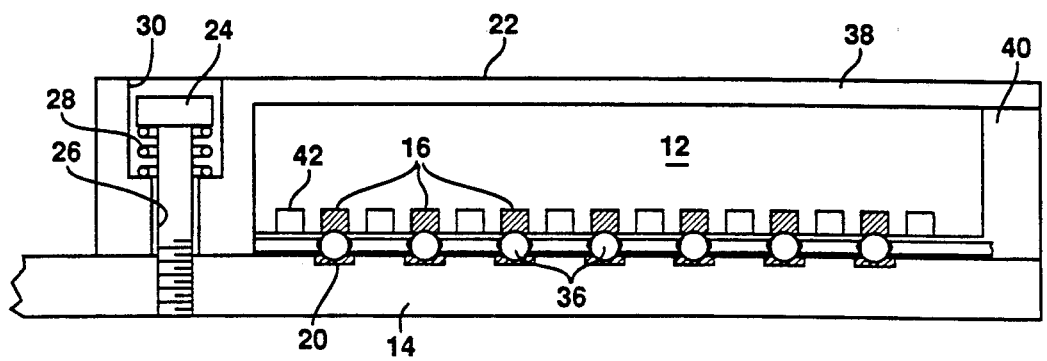
FIG. 4 is a side view similar to FIG. 2 showing the electronic package and interposer inserted into the space between the clamp and circuit board.

As shown in FIG. 3, the clamp 22 is mounted to the circuit board 14 so that the top wall 38 of the clamp is separated from the board 14 by a space 40 having a distance D. As shown in FIG. 4, the interposer 32 and package 12 are inserted into the space 40 until the conductive members 36 are aligned with both the first 16 and second 20 conductive pads. The combined thickness d of the package 12 and conductive members 36 is greater than the distance D, so that the clamp 22 is translated away from the circuit board 14 when the package 12 and interposer 32 are inserted into the space 40. Movement of the clamp 22 compresses the springs 28 which apply a force to the package 12. The spring force presses the conductive members 36 into contact with the first 16 and second 20 conductive pads, to electrically couple the package 12 to the circuit board 14. The assembly 10 should be constructed so that the spring pressure is great enough to prevent an undesirable voltage drop between the pads 16 and 20, yet small enough so that only a low insertion force is needed to push the package 12 and interposer 32 between the clamp 22 and board 14. Although a spring loaded clamp 22 is shown and described, it is to be understood that the assembly 10 may function without springs, wherein the clamp 22 is constructed to be flexible enough to deflect when the package 12 and interposer 32 are inserted into the space 40. Although a single package 12 is shown, the clamp 22 may be constructed to receive a plurality of packages 12.

The first conductive pads 16 are preferable constructed from a conductive elastomeric material which is either punched or cast into holes formed in the package 12. The elastomeric conductive pads 16 can be constructed to provide a fixed resistive value between the integrated circuit and the circuit board 14. The resistive value can provide impedance control for the package, which is particularly advantageous for high speed devices.

The elastomeric pads 16 are typically compressed when the package 12 and interposer 32 are inserted into the space 40. The flexibility of the elastomeric pads 16 compensates for tolerances in the assembly, particularly deviations in the flatness of the package 12 and the circuit board 14. The package 12 may also have a plurality of holes 42 in the bottom surface 18 arranged in an alternating relationship with the first conductive pads 16.

As shown in FIG. 3, the package 12 is preferably placed on the interposer 32 so that the conductive spheres 36 initially extend into the holes 42. The package 12 and interposer 32 are then inserted into the space 40 until the interposer 32 comes into contact with the back wall 44 of the clamp 22. The package 12 is then moved until the package 12 comes into contact with the clamp 22 and the conductive members 36 are aligned with the pads 16 and 20. The holes 42 maintain the position of the conductive members 36 so that the package 12 and interposer 32 do not move relative to each other when the two members are inserted into the space 40. Although the package 12 and interposer 32 are shown being inserted into the space 40 together, it is to be understood that the interposer 32 can be initially inserted completely into the space 40 before the package 12 is pushed between the clamp 22 and the interposer 32.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic packaging assembly, comprising:
    a circuit board having a plurality of first conductive pads;
    an electronic package having a plurality of second conductive pads, said electronic package further having a plurality of holes adjacent to said second conductive pads;
    an interposer between said electronic package and said circuit board, said interposer having a plurality of openings;
    a plurality of conductive members located within said openings of said interposer, said conductive members being in operative contact with said first and second conductive pads such that said electronic package is electrically coupled to said circuit board, said conductive members being adapted to rotate relative to said interposer; and,
    pressure means for applying pressure to said electronic package so that said conductive members are pressed into operative contact with said first and second conductive pads.

2. The assembly as recited in claim 1, wherein said circuit board has a plurality of first conductive pads arranged in a pattern, said electronic package has a plurality of second conductive pads arranged in the pattern and said interposer has a plurality of openings and conductive members arranged in the pattern.

3. The assembly as recited in claim 1, wherein said pressure means is a clamp coupled to said circuit board by a spring.

4. The assembly as recited in claim 1, wherein said second conductive pad is constructed from a conductive elastomer.

5. The assembly as recited in claim 1, wherein said conductive member is shaped as a sphere.

6. The assembly as recited in claim 1, wherein said interposer is adapted to capture said conductive member.

7. An electronic packaging assembly, comprising:
   a circuit board having a plurality of first conductive pads arranged in a pattern;
   an electronic package having a plurality of second conductive pads arranged in the same pattern as said first conductive pads, said second conductive pads being constructed from a conductive elastomer;
   an interposer between said electronic package and said circuit board, said interposer having a plurality of openings arranged in the same pattern as said first and second conductive pads;
   a plurality of conductive members located within said openings of said interposer, said conductive members being in operative contact with said first and second conductive pads such that said electronic package is electrically coupled to said circuit board, said conductive members being adapted to rotate relative to said interposer;
   a clamp coupled to said circuit board and said electronic package, said clamp being adapted to apply a pressure to said electronic package, said clamp having three walls that define an inner cavity and an opening that allows said interposer to roll into said inner cavity; and,
   spring means for applying a pressure to said electronic package so that said conductive members are pressed into operative contact with said first and second conductive pads.

8. The assembly as recited in claim 7, wherein said electronic package has a plurality of holes adjacent to said first conductive pads adapted to receive said conductive members.

9. The assembly as recited in claim 8, wherein said interposer is adapted to capture said conductive members.

10. The assembly as recited in claim 9, wherein said conductive members are each shaped as a sphere.

11. A method of connecting an electronic package to a circuit board, comprising the steps of:
   a) providing a clamp that is separated from a circuit board by a first predetermined space, said circuit board having a first conductive pad; and,
   b) inserting between said clamp and said circuit board an electronic package with a second conductive pad and an interposer that contains a conductive member until said conductive member is aligned with said first and second conductive pads, said electronic package and said conductive member having a combined uncompressed thickness that is greater than said first space such that said clamp presses said conductive member into operative contact with said first and second conductive pads when said electronic package and said interposer are inserted between said clamp and said circuit board.

12. The method as recited in claim 11, wherein said conductive member rolls along said circuit board when said electronic package and said interposer are inserted between said clamp and said circuit board.

13. The method as recited in claim 11, wherein said interposer is inserted between said clamp and said circuit board before said electronic package is inserted between said clamp and said circuit board.

* * * * *